United States Patent
Byun et al.

(10) Patent No.: US 7,477,715 B2
(45) Date of Patent: Jan. 13, 2009

(54) DELAY-LOCKED LOOP CIRCUIT OF A SEMICONDUCTOR DEVICE AND METHOD OF CONTROLLING THE SAME

(75) Inventors: Young-Yong Byun, Seoul (KR); Dong-Jin Lee, Seoul (KR); Hi-Choon Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 21 days.

(21) Appl. No.: 11/623,925

(22) Filed: Jan. 17, 2007

(65) Prior Publication Data
US 2007/0176657 A1  Aug. 2, 2007

(30) Foreign Application Priority Data
Feb. 1, 2006  (KR) .................... 10-2006-0009703

(51) Int. Cl.
H03D 3/24  (2006.01)
(52) U.S. Cl. ...................... 375/373; 327/158
(58) Field of Classification Search ............. None
See application file for complete search history.

(56) References Cited

U.S. PATENT DOCUMENTS

| | | | |
|---|---|---|---|
| 6,247,138 B1 * | 6/2001 | Tamura et al. | 713/600 |
| 6,643,787 B1 * | 11/2003 | Zerbe et al. | 713/400 |
| 6,678,206 B2 * | 1/2004 | Chu et al. | 365/189.08 |
| 6,836,503 B2 * | 12/2004 | Best et al. | 375/355 |
| 6,934,215 B2 * | 8/2005 | Chung et al. | 365/233.12 |
| 7,039,147 B2 * | 5/2006 | Donnelly et al. | 375/373 |
| 7,184,509 B2 * | 2/2007 | Cho et al. | 375/373 |
| 7,199,634 B2 * | 4/2007 | Cho et al. | 327/175 |

FOREIGN PATENT DOCUMENTS

| | | |
|---|---|---|
| JP | 08-147967 | 6/1996 |
| JP | 2001-250382 | 9/2001 |
| KR | 100253367 | 1/2000 |
| KR | 1020010004224 | 1/2001 |
| KR | 1020020075572 | 10/2002 |
| KR | 1020040020171 | 3/2004 |

* cited by examiner

*Primary Examiner*—Cassandra Cox
(74) *Attorney, Agent, or Firm*—F. Chau & Associates, LLC

(57) ABSTRACT

A delay-locked loop (DLL) circuit includes a standby signal generating circuit, a front stage circuit, and a back stage circuit. The standby signal generating circuit generates a first standby signal and a second standby signal in response to an active signal, a crock enable signal, a first column address strobe (CAS) latency signal, and a second CAS latency signal. The front stage circuit compares the phase of an external clock signal and the phase of a feedback signal and delays the external clock signal based on the phase difference between the external clock signal and the feedback signal to generate a first clock signal. The back stage circuit executes interpolation and duty-cycle correction on the first clock signal.

15 Claims, 4 Drawing Sheets

FIG.4

|     | CKE |     |     |
|-----|-----|-----|-----|
|     |     | L   | H   |
| ACT | L   | 2P  | 2N  |
|     | H   | 3P  | 3N  |

FIG.5

|     | STBY | STBY3P |
|-----|------|--------|
| CL3 | H    | H      |
| CL4 | L    | H      |

DELAY-LOCKED LOOP CIRCUIT OF A SEMICONDUCTOR DEVICE AND METHOD OF CONTROLLING THE SAME

CROSS-REFERENCE TO RELATED PATENT APPLICATION

This application claims priority under 35 USC § 119 to Korean Patent Application No. 2006-9703, filed on Feb. 1, 2006, the disclosure of which is herein incorporated by reference in its entirety.

BACKGROUND OF THE INVENTION

1. Technical Field

The present disclosure relates to a delay-locked loop circuit and, more particularly, to a delay-locked loop circuit of a semiconductor device and a method of controlling the same.

2. Discussion of Related Art

A delay-locked loop (DLL) circuit is frequently used in semiconductor integrated circuits to generate an internal clock signal. In a conventional DLL the internal crock signal is generated by delaying a system crock signal or an external clock signal by a predetermined time. The DLL detects the phase difference between the internal crock signal and the external clock signal and controls a delay time by performing a shift operation to synchronize the internal clock signal and the external clock signal.

A conventional semiconductor memory device includes a plurality of memory cells for storing data. In a conventional semiconductor memory device such as dynamic random-access memory (DRAM), the internal clock signal generated by a DLL may be used as a timing signal for read and write operations of the DRAM. A write operation is performed to store data to the memory cells, and a read operation is performed to output the data stored in the memory cells. Generally, the write operation has an active mode and a write mode, and the read operation has an active mode and a read mode. In the active mode, the semiconductor memory device generates an active command signal to activate the memory cells in preparation for a following write mode or read mode. When operated in the read mode, the semiconductor memory device generates a read command signal and accesses activated memory cells to read the stored data therein.

In general, in semiconductor memory devices, the current drawn when the memory cells are activated in the active mode or accessed in the read mode is greater than the nominal current drawn. Therefore, when the memory cells are activated in the active mode or accessed in the read mode, an internal supply voltage may be lowered and the voltage supplied to the DLL may be changed. When the voltage supplied to the DLL is changed, the delay time applied to the external clock signal may be changed and the synchronization between the external clock signal and the internal clock signal may not be completed. When there is no synchronization between the external and the internal clock signals, the DLL performs a shift operation, controls the delay time, and compensates for the voltage drop. As a result, the external clock signal and the internal clock signal may be synchronized by the DLL.

In the operation of semiconductor memory devices, there may be a time period in which all or a part of a circuit is inactive. Accordingly, a need exists for a circuit capable of deactivating the DLL when its operation is not required.

SUMMARY OF THE INVENTION

In an exemplary embodiment of the present invention, a delay-locked loop (DLL) circuit includes a standby signal generating circuit, a front stage circuit, and a back stage circuit. The standby signal generating circuit generates a first standby signal and a second standby signal in response to an active signal, a clock enable signals a first column address strobe (CAS) latency signal, and a second CAS latency signal. The front stage circuit compares the phase of an external clock signal and the phase of a feedback signal and delays the external clock signal based on the phase difference between the external clock signal and the feedback signal to generate a first clock signal. The front stage circuit may be deactivated in response to the first standby signal. The back stage circuit executes interpolation and duty-cycle correction on the first clock signal. The back stage circuit may be deactivated in response to the second standby signal.

In an exemplary embodiment of the present invention, the standby signal generating circuit includes a first inverter, a second inverter, a first logical gate, a second logical gate, a third logical gate, and a fourth logical gate.

The first inverter may invert the active signal, and the second inverter may invert the second GAS latency signal. The first logical gate may execute a logical OR operation on the first CAS latency signal and the second CAS latency signal. The second logical gate may perform a logical AND operation on the first CAS latency signal and an output signal of the second inverter. The third logical gate may perform a logical AND operation on an output signal of the first inverter, the clock enable signal, and an output signal of the first logical gate to generate the second standby signal. The fourth logical gate may perform a logical AND operation on an output signal of the first inverter, the clock enable signal, and an output signal of the second logical gate to generate the first standby signal.

In an exemplary embodiment of the present invention, a method of controlling a delay-locked loop (DLL) circuit includes generating a first standby signal and a second standby signal in response to an active signal, a clock enable signal, a first column address strobe (GAS) latency signals and a second CAS latency signal; deactivating a front stage circuit in response to the first standby signal in a first operation mode of a semiconductor memory device; deactivating a back stage circuit in response to the second standby signal in the first operation mode of the semiconductor memory device; and deactivating the back stage circuit in response to the second standby signal in a second operation mode of the semiconductor memory device.

In an exemplary embodiment of the present invention, the first standby signal and the second standby signal may be activated when the clock enable signal is enabled and the active signal is disabled.

BRIEF DESCRIPTION OF THE DRAWINGS

The present invention will become readily apparent to those of ordinary skill in the art when descriptions of exemplary embodiments thereof are read with reference to the accompanying drawings.

FIG. 4 and FIG. 5 are tables illustrating conditions in which standby signals are generated by the standby-signal generating circuit shown in FIG. 2, according to exemplary embodiments of the present invention.

DESCRIPTION OF EXEMPLARY EMBODIMENTS

Figure 1:
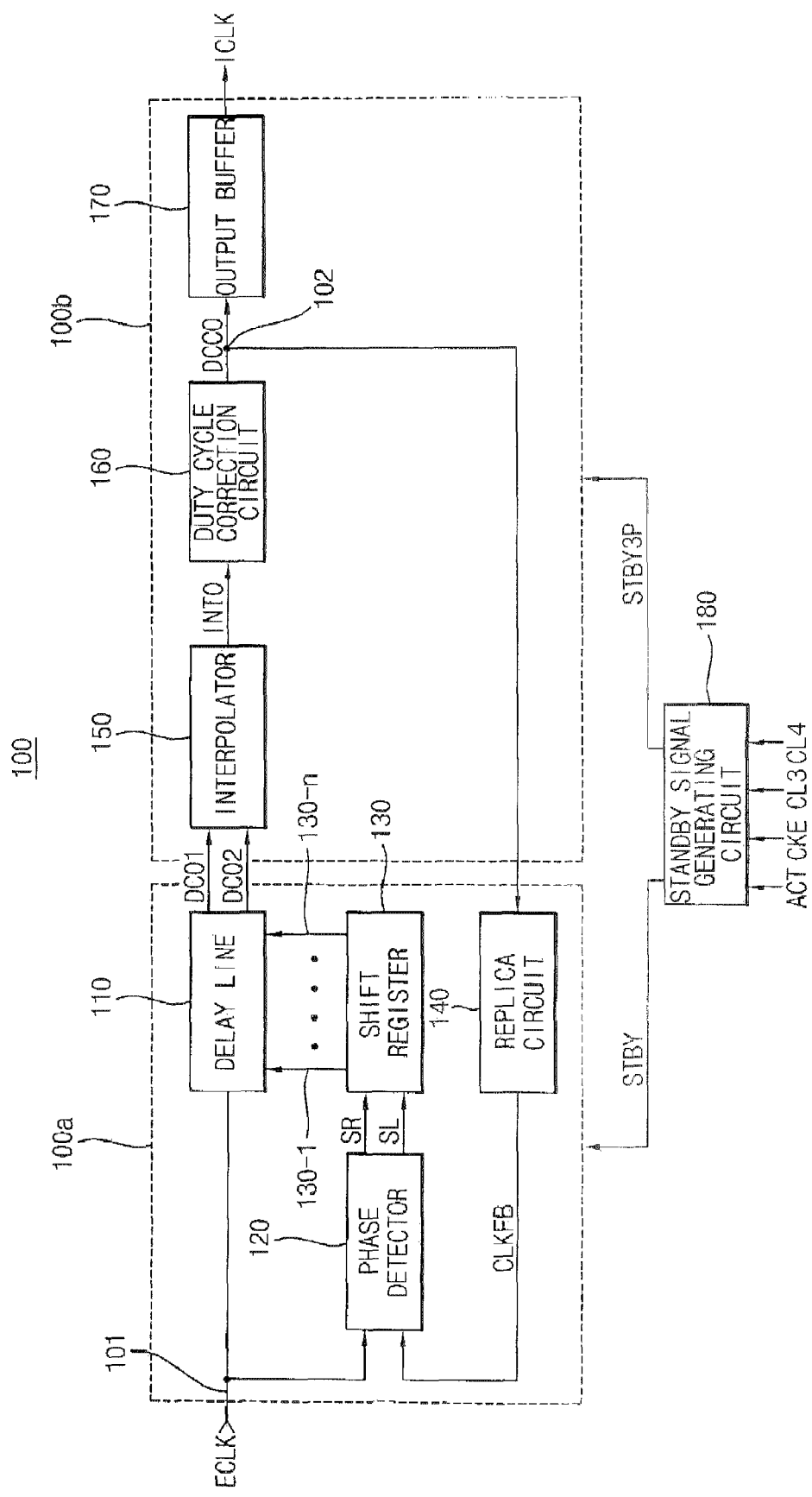
FIG. 1 is a block diagram illustrating a delay-locked loop (DLL) circuit according to an exemplary embodiment of the present invention.

Exemplary embodiments of the present invention will be described in detail with reference to the accompanying drawings. Like reference numerals refer to similar or identical elements throughout the description of the figures.

FIG. 1 is a block diagram illustrating a delay-locked loop (DLL) circuit according to an exemplary embodiment of the present invention.

Referring to FIG. 1, the DULL circuit 100 includes a standby signal generating circuit 180, a front stage circuit 100a, and a back stage circuit 100b.

The standby signal generating circuit 180 generates a first standby signal STBY and a second standby signal STBY3P. For example, the standby signal generating circuit 180 may generate the first standby signal STBY and the second standby signal STBY3P in response to an active signal ACT a clock enable signal CKE, a first column address strobe (CAS) latency signal CL3, and a second CAS latency signal CL4.

The front stage circuit 100a compares the phase of an external clock signal ECLK and the phase of a feedback signal CLKFB and delays the external clock signal ECLK based on the phase difference between the external clock signal ECLK and the feedback signal CLKFB to generate a first clock signal DCO1 and a second clock signal DCO2. The front stage circuit 100a may be deactivated in response to the first standby signal STBY.

The back stage circuit 100b executes interpolation and duty-cycle correction on the first clock signal DCO1 and the second clock signal DCO2. The back stage circuit 100b may be deactivated in response to the second standby signal STBY3P.

The front stage circuit 100a includes a delay line 110, a phase detector 120, and a shift register 130.

The delay line 110 delays the external clock signal ECLK by a predetermined time to generate the first clock signal DCO1 and the second clock signal DCO2 in response to a plurality of delay control bits 130_1 to 130_n. The phase detector 120 compares the phase of the external clock signal ECLK and the phase of the feedback signal CLKFB to generate a first shift control signal SL and a second shift control signal SR. The shift register 130 performs a shifting operation based on the first shift control signal SL and the second shift control signal SR to generate the plurality of delay control bits 103_1 to 103_n.

The front stage circuit 100a may include a replica circuit 140 that receives a third clock signal DCCO that is duty-cycle corrected from the back stage circuit 100b. The replica circuit 140 delays the third clock signal by a predetermined time to generate the feedback signal CLKFB.

The back stage circuit 100b comprises an interpolator 150, a duty cycle correction circuit 160, and an output buffer 170.

The interpolator 150 generates a fourth clock signal INTO that is between the first clock signal DCO1 and the second clock signal DCO2 with respect to the time axis. The duty cycle correction circuit 160 corrects a duty cycle of the fourth clock signal INTO. The output buffer 170 buffers an output signal DCCO of the duty cycle correction circuit 160 to generate an internal clock signal ICLK. In an exemplary embodiment of the present invention, the output signal DCCO of the duty cycle correction circuit 160 is also provided to the replica circuit 140 as the third clock signal.

Hereinafter, operations of the DLL circuit 100 according to an exemplary embodiment of the present invention will be described with reference to FIG. 1.

The DLL circuit 100 receives the external clock signal ECLK from the input line 101, and generates the internal clock signal ICLK that is synchronized with the external clock signal ECLK. The replica circuit 140 delays the output signal DCCO of the duty cycle correction circuit 160 by the delay time of the output buffer 170 to generate the feedback signal CLKFB that is substantially identical to the internal clock signal ICLK. In an exemplary embodiment of the present invention described in connection with FIG. 1, the replica circuit 140 is included in the front stage 100a. However, it is to be understood that the replica circuit 140 may be included in the back stage circuit 100b, or may be external to the front stage 100a and the back stage circuit 100b.

The DLL circuit 100 performs a shifting operation to generate the delay control bits 130_1 to 130_n based on the first shift control signal SL and the second shift control signal SR. The delay line 110 delays the external clock signal ECLK by a predetermined time in response to a plurality of delay control bits 130_1 to 130_n. The delay time being generated by the delay line 110 may be controlled according to the values of the delay control bits 130_1 to 130_n. The first shift control signal SL and the second shift control signal SR are activated when the phase of the external clock signal ECLK and the phase of the feedback clock signal CLKFB do not correspond to each other.

The phase difference between the external clock signal ECLK and the feedback clock signal CLKFB may be generated by changes in operating conditions of a semiconductor memory device, such as for example, a voltage drop of a supply voltage during an active mode. When the voltage drop of the supply voltage is detected, the DLL circuit 100 performs the shifting operation to correct the voltage drop. The internal clock signal ICLK may be synchronized with the external clock signal ECLK by repetitive phase detection and delay time control. The output buffer 170 may be a path between an output of the duty cycle correction circuit 160 and a point where the internal clock signal ICLK is used.

The DLL circuit 100 need not be activated at all times, that is, a part of the circuit or the whole circuit may be deactivated in a time period in which the circuit need not be operated. The time period in which the DLL circuit 100 does not operate may correspond to a time period in which the clock enable signal CKE is enabled and the active signal ACT is disabled.

Figure 2:
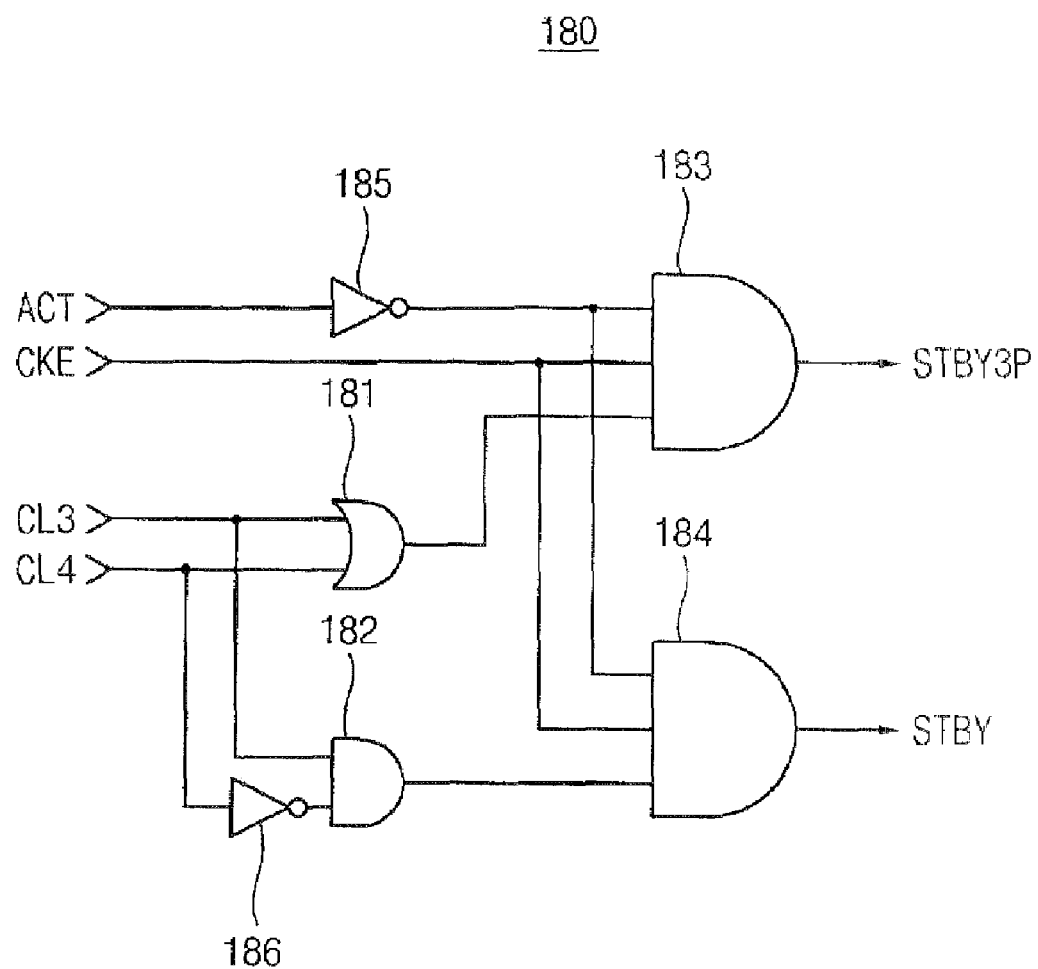
FIG. 2 is a circuit diagram illustrating a standby-signal generating circuit of the DLL circuit shown in FIG. 1, according to an exemplary embodiment of the present invention.

FIG. 2 is a circuit diagram illustrating a standby-signal generating circuit of the DLL circuit shown in FIG. 1, according to an exemplary embodiment of the present invention.

Referring to FIG. 2, the standby-signal generating circuit 180 includes a first inverter 185, a second inverter 186, an OR gate 181, a first AND gate 182, a second AND gate 183, and a third AND gate 184.

The first inverter 185 inverts the active signal ACT and the second inverter 186 inverts the second CAS latency signal CL4. The OR gate 181 performs a logical OR operation on the first CAS latency signal CL3 and the second CAS latency signal CL4. The first AND gate 182 performs a logical AND operation on the first GAS latency signal CL3 and the output signal of the second inverter 186. The second AND gate 183 performs a logical AND operation on an output signal of the first inverter 185, the clock enable signal CKE, and an output signal of the OR gate 181 to generate the second standby signal STBY3P. The third AND gate 184 performs a logical AND operation on the output signal of the first inverter 185, the clock enable signal CKE, and an output signal of the first AND gate 182 to generate the first standby signal STBY.

Figure 3:
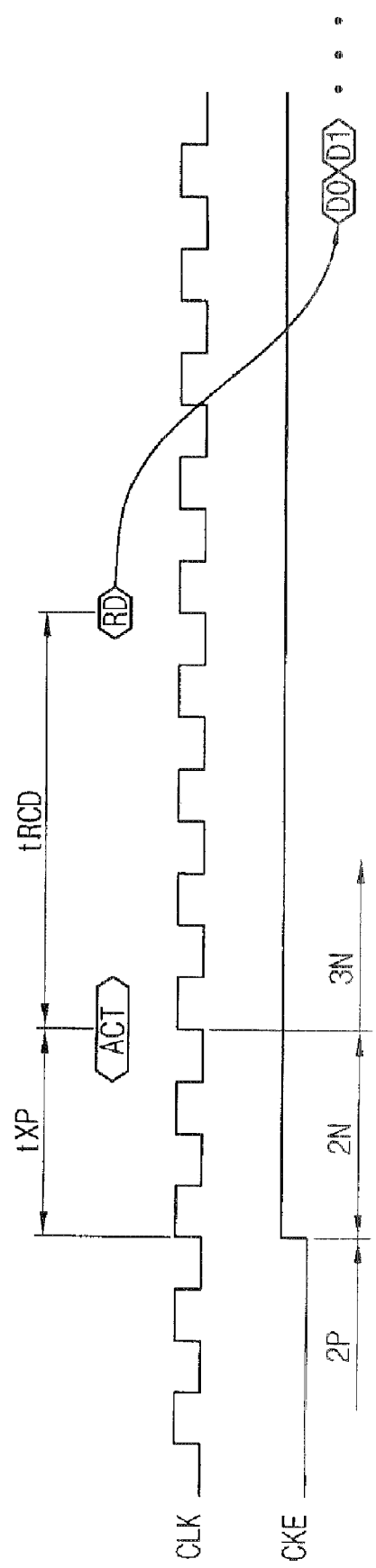
FIG. 3 is a timing diagram illustrating periods in which standby signals are generated by the standby-signal generating circuit shown in FIG. 2, according to an exemplary embodiment of the present invention.

FIG. 3 is a timing diagram illustrating periods in which standby signals are generated by the standby-signal generating circuit shown in FIG. 2, according to an exemplary embodiment of the present invention.

Referring to FIG. 3, the time period tXP corresponds to a time period from a first time point at which the clock enable signal CKE is enabled to a second time point at which the active signal ACT is generated. In FIG. 3, the time period tXP is also denoted by 2N. The time period before the clock enable signal CKE is enabled is denoted by 2P, and the time period after the active signal ACT is activated is denoted by 3N. In the time period 2N, a part of the circuit or the whole circuit of the DLL circuit 100 shown in FIG. 1 may not be operated. The time period from the second time point at which the active signal ACT is generated to a third time point at which the read command is generated is denoted by tRCD. As shown in FIG. 3, the data DO is outputted after 4 clock cycles from the third time point at which the read command RD is generated. That is, a semiconductor memory device according to an exemplary embodiment of the present invention described in connection with FIG. 3 may operate in a CAS latency 4 (CL4) mode.

FIG. 4 and FIG. 5 are tables illustrating conditions in which standby signals are generated by the standby-signal generating circuit shown in FIG. 2, according to exemplary embodiments of the present invention.

Referring to FIG. 4, the time period in which the standby signals STBY and STBY3P, which may deactivate a part or a whole circuit of the DLL circuit 100, are enabled, for example, the time period in which the active signal ACT has a logic "low" state and the clock enable signal CKE has a logic "high" state, is denoted by 2N. The time period in which the active signal ACT has a logic "low" state and the clock enable signal CKE has a logic "low" state is denoted by 2P. The time period in which the active signal ACT has a logic "high" state and the clock enable signal CKE has a logic "high" state is denoted by 3N. The time period in which the active signal ACT has a logic "high" state and the clock enable signal CKE has a logic "low" state is denoted by 3P in the table of FIG. 4.

In FIG. 5, the first CAS latency signal CL3 represents an operating mode of a semiconductor memory device in which data DO is outputted after 3 clock cycles from a time point in which the read command RD in FIG. 3 is generated. The second GAS latency signal CL4 represents an operating mode of a semiconductor memory device in which data DO is outputted after 4 clock cycles from a time point in which the read command RD in FIG. 3 is generated.

Referring to FIG. 5, a semiconductor memory device may operate in a CL3 mode, such that when the first CAS latency signal CL3 has a logic "high" state and the second CAS latency signal CL4 has a logic "low" state, the first standby signal STBY and the second standby signal STBY3P have a logic "high" state. A semiconductor memory device may operate in a CL4 mode, such that when the first CAS latency signal CL3 has a logic "low" state and the second CAS latency signal CL4 has a logic "high" state, the first standby signal STBY has a logic "low" state and the second standby signal STBY3P has a logic "high" state.

Hereinafter, operations of the standby-signal generating circuit 180 of the DLL circuit shown in FIG. 1, according to an exemplary embodiment of the present invention, will be described.

Referring to FIG. 2, a semiconductor memory device may operate in a CL3 mode, such that when the first CAS latency signal CL3 has a logic "high" state and the second CAS latency signal CL4 has a logic "low" state, the first standby signal STBY and the second standby signal STBY3P have a logic "high" state. In this case, the front stage circuit 100*a* and the back stage circuit 100*b* of the DLL circuit 100 are all deactivated. That is, when a semiconductor memory device operates in a CL3 mode, according to an exemplary embodiment of the present invention, the front stage circuit 100*a* and the back stage circuit 100*b* of the DLL circuit 100 do not operate.

A semiconductor memory device may operate in a CL4 mode, such that when the first GAS latency signal CL3 has a logic "low" state and the second CAS latency signal CL4 has a logic "high" state, the first standby signal STBY has a logic "low" state and the second standby signal STBY3P has a logic "high" state. In this case, the front stage circuit 100*a* is activated, and the back stage circuit 100*b* is deactivated. That is, when a semiconductor memory device operates in a CL4 mode, according to an exemplary embodiment of the present invention, the front stage circuit 100*a* operates and the back stage circuit 100*b* does not operate. Operations of a standby signal generating circuit according to an exemplary embodiment of the present invention described in connection with FIG. 2 correspond to the table of FIG. 5.

As described above, a semiconductor memory device may operate in a CL3 or CL4 mode. However, it is to be understood that a DLL circuit according to exemplary embodiments of the present invention may be applied to semiconductor memory devices that operate in various operating modes.

A DLL circuit according to exemplary embodiments of the present invention may be used in various semiconductor devices, including but not limited to, semiconductor memory devices.

A DLL circuit according to an exemplary embodiment of the present invention may deactivate a part of the circuit or the whole circuit in a time period in which the circuit need not be operated. A semiconductor device including the DLL circuit according to an exemplary embodiment of the present invention may have low power consumption.

Although exemplary embodiments of the present invention have been described in detail with reference to the accompanying drawings for the purpose of illustration, it should be understood that the inventive processes and apparatus should not be construed as limited thereby. It will be apparent to those of ordinary skill in the art that various modifications to the foregoing exemplary embodiments may be made without departing from the scope of the invention as defined by the appended claims, with equivalents of the claims to be included therein.

What is claimed is:

1. A delay-locked loop (DLL) circuit comprising:
    a standby signal generating circuit configured to generate a first standby signal and a second standby signal in response to an active signal, a clock enable signal, a first column address strobe (CAS) latency signal, and a second CAS latency signal;
    a front stage circuit configured to compare a phase of an external clock signal and a phase of a feedback signal and delay the external clock signal based on a phase difference between the external clock signal and the feedback signal to generate a first clock signal; and a back stage circuit configured to execute interpolation and duty-cycle correction on the first clock signal.

2. The DLL circuit of claim 1, wherein the first standby signal and the second standby signal are activated when the clock enable signal is enabled and the active signal is disabled.

3. The DLL circuit of claim 1, wherein the first CAS latency signal is a signal corresponding to a first operation mode of a semiconductor memory device, and wherein the second CAS latency signal is a signal corresponding to a second operation mode of the semiconductor memory device.

4. The DLL circuit of claim 1 wherein the standby signal generating circuit comprises:

a first inverter configured to invert the active signal;

a second inverter configured to invert the second CAS latency signal;

a first logical gate configured to perform a logical OR operation on the first CAS latency signal and the second CAS latency signal;

a second logical gate configured to perform a logical AND operation on the first GAS latency signal and the output signal of the second inverter;

a third logical gate configured to perform a logical AND operation on an output signal of the first inverter, the clock enable signal, and an output signal of the first logical gate to generate the second standby signal; and a fourth logical gate configured to perform a logical AND operation on an output signal of the first inverter, the clock enable signal, and the output signal of the second logical gate to generate the first standby signal.

5. The DLL circuit of claim 1, wherein the front stage circuit comprises:

a delay line configured to delay the external clock signal by a predetermined time to generate the first clock signal in response to a plurality of delay control bits;

a phase detector configured to compare the phase of the external clock signal and the phase of the feedback signal to generate a shift control signal; and a shift register configured to perform a shifting operation based on the shift control signal to generate the plurality of delay control bits.

6. The DLL circuit of claim 5 wherein the front stage circuit further comprises a replica circuit configured to receive a second clock signal that is duty-cycle corrected from the back stage circuit and configured to delay the second clock signal by a predetermined time to generate the feedback signal.

7. The DLL circuit of claim 6, wherein the first clock signal comprises a third clock signal and a fourth clock signal.

8. The DLL circuit of claim 7, wherein the back stage circuit comprises:

an interpolator configured to generate a fifth clock signal that is between the third clock signal and the fourth clock signal with respect to a time axis;

a duty-cycle correction circuit configured to correct a duty cycle of the fifth clock signal; and an output buffer configured to buffer an output signal of the duty-cycle correction circuit to generate an internal clock signal.

9. The DLL circuit of claim 1, wherein the front stage circuit is further configured to be deactivated in response to the first standby signal.

10. The DLL circuit of claim 1, wherein the back stage circuit is further configured to be deactivated in response to the second standby signal.

11. A method of controlling a delay-locked loop (DLL) circuit, the method comprising:

generating a first standby signal and a second standby signal in response to an active signal, a clock enable signal, a first column address strobe (GAS) latency signal, and a second CAS latency signal;

deactivating a front stage circuit in response to the first standby signal in a first operation mode of a semiconductor memory device;

deactivating a back stage circuit in response to the second standby signal in the first operation mode of the semiconductor memory device; and deactivating the back stage circuit in response to the second standby signal in a second operation mode of the semiconductor memory device.

12. The method of claim 11, wherein the first standby signal and the second standby signal are activated when the clock enable signal is enabled and the active signal is disabled.

13. The method of claim 11, wherein the first GAS latency signal is a signal corresponding to the first operation mode of the semiconductor memory device, and wherein the second GAS latency signal is a signal corresponding to the second operation mode of the semiconductor memory device.

14. The method of claim 11 wherein of the semiconductor memory device has a first CAS latency when operating in the first operation mode.

15. The method of claim 11, wherein of the semiconductor memory device has a second CAS latency when operating in the second operation mode.

* * * * *